US006281035B1

(12) United States Patent
Gessert

(10) Patent No.: US 6,281,035 B1
(45) Date of Patent: *Aug. 28, 2001

(54) ION-BEAM TREATMENT TO PREPARE SURFACES OF P-CDTE FILMS

(75) Inventor: Timothy A. Gessert, Conifer, CO (US)

(73) Assignee: Midwest Research Institute, Kansas City, MO (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/937,721

(22) Filed: Sep. 25, 1997

(51) Int. Cl.[7] .................................................. H01L 21/44
(52) U.S. Cl. .............................. 438/84; 438/98; 438/603
(58) Field of Search .................................. 438/83, 84, 85, 438/86, 93, 94, 95, 96, 97, 98, 102, 603, 712, 718, 974, 513, 525, 528, 474

(56) References Cited

U.S. PATENT DOCUMENTS

| | | | |
|---|---|---|---|
| 3,615,875 | * 10/1971 | Morita et al. | |
| 4,319,069 | 3/1982 | Tyan | 136/258 |
| 4,411,732 | * 10/1983 | Wotherspoon | 156/643 |
| 4,456,630 | 6/1984 | Basol | 427/88 |
| 4,581,099 | 4/1986 | Fukaya et al. | 156/643 |
| 4,652,795 | * 3/1987 | Lee et al. | 313/360 |
| 4,766,084 | 8/1988 | Borey et al. | 437/3 |
| 4,942,138 | * 7/1990 | Miki | 156/643 |
| 5,009,743 | * 4/1991 | Swann | 156/643 |
| 5,017,511 | * 5/1991 | Elkind et al. | 148/DIG. 51 |
| 5,213,998 | * 5/1993 | Qiu et al. | 148/DIG. 64 |
| 5,496,772 | * 3/1996 | Ebe et al. | 204/192.14 |

* cited by examiner

*Primary Examiner*—Savitri Mulpuri
(74) *Attorney, Agent, or Firm*—Paul J. White; Ken Richardson

(57) ABSTRACT

A method of making a low-resistance electrical contact between a p-CdTe layer and outer contact layers by ion beam processing comprising:

a) placing a CdS/CdTe device into a chamber and evacuating the chamber;

b) orienting the p-CdTe side of the CdS/CdTe layer so that it faces apparatus capable of generating Ar atoms and ions of preferred energy and directionality;

c) introducing Ar and igniting the area of apparatus capable of generating Ar atoms and ions of preferred energy and directionality in a manner so that during ion exposure, the source-to-substrate distance is maintained such that it is less than the mean-free path or diffusion length of the Ar atoms and ions at the vacuum pressure;

d) allowing exposure of the p-CdTe side of the device to said ion beam for a period less than about 5 minutes; and e) imparting movement to the substrate to control the real uniformity of the ion-beam exposure on the p-CdTe side of the device.

4 Claims, 9 Drawing Sheets

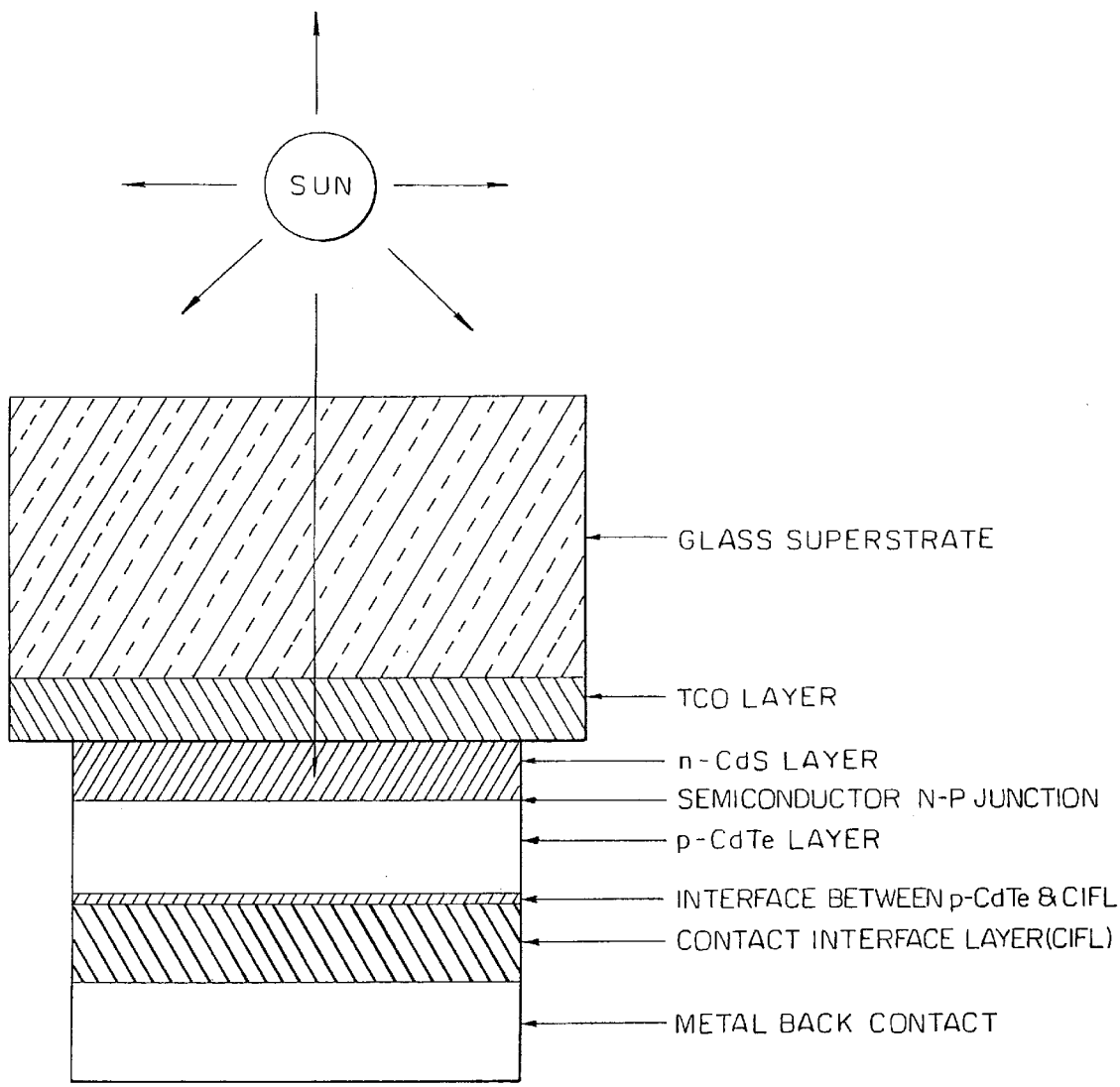

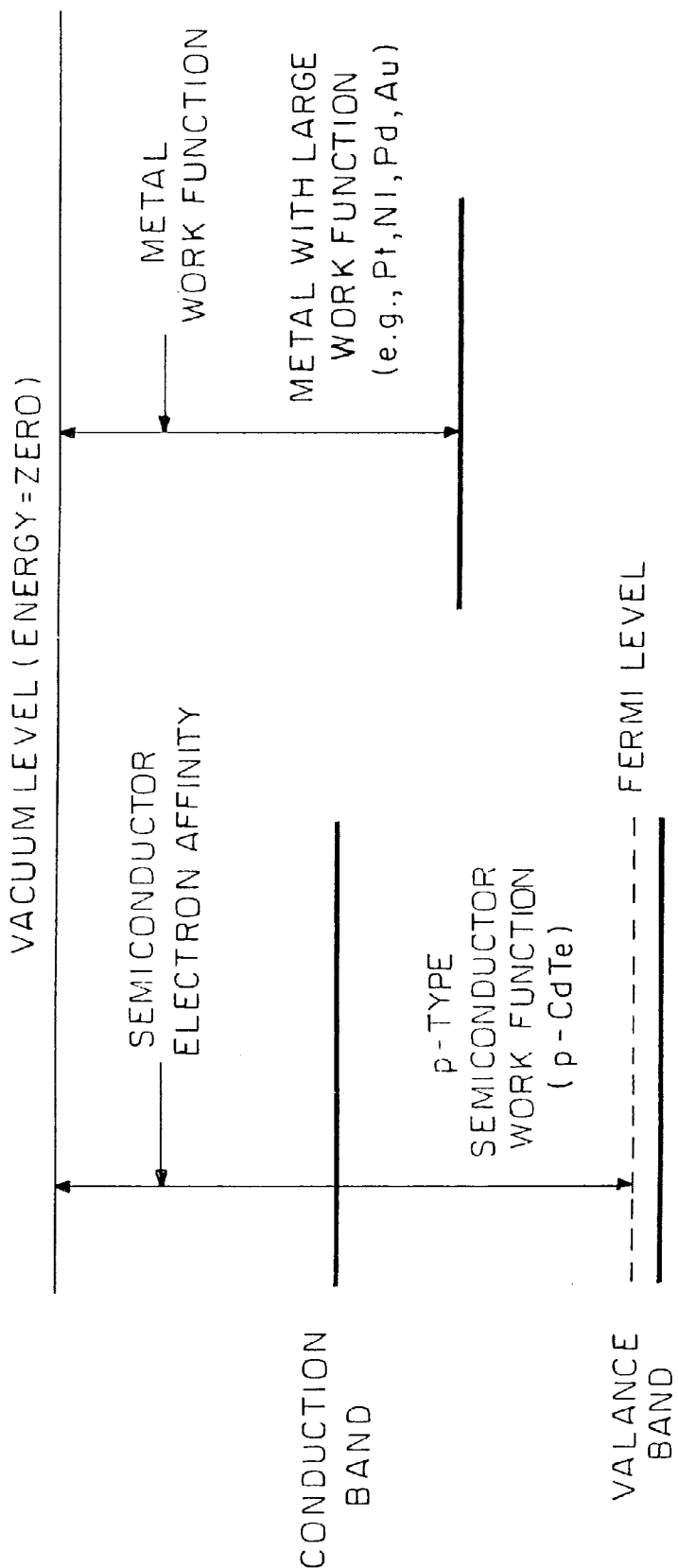

1 μm

1 μm

ION-BEAM TREATMENT TO PREPARE SURFACES OF P-CDTE FILMS

CONTRACTUAL ORIGIN OF THE INVENTION

The United States Government has rights in this invention pursuant to Contract No. DE-AC36-83CH10093 between the United States Department of Energy and the Midwest Research Institute.

FIELD OF THE INVENTION

This invention relates to the use of ion-beam processing to prepare surfaces of p-CdTe thin films for application of ohmic contacts.

Ion-beam etching is used to prepare the surface of p-type CdTe films so that wet chemical treatments are avoided. These processes may be used for application in preparing photovoltaic and other devices to improve device performance by decreasing the losses associated with the back metal contact.

BACKGROUND OF THE INVENTION

A typical single-junction photovoltaic cell is comprised of a substrate on which to form the device, two ohmic contacts to conduct current to an external electrical circuit, and two or more semiconductor layers in series to form the semiconductor junction. At least one of these semiconductor layers (the absorber) is chosen so that its bandgap is of a value for near optimum conversion of solar radiation. In the typical design, one semiconductor layer is doped n-type, and the adjacent layer is doped p-type. The intimate proximity of these layers forms a semiconductor p-n junction. The p-n junction provides an electric field that facilitates charge separation in the absorber layer(s) when the cell is illuminated, and charge collection at the ohmic contacts.

In the standard photovoltaic cell including the substrate for mounting the cell and two ohmic contacts for conducting current to an external electrical circuit, in addition to the n-type layer and the p-type layer of a two layer semiconductor cell, a three layer cell typically includes an intrinsic (i-type) layer disposed between the n-type layer and the p-type layer for absorption of light.

In the photovoltaic cell, the semiconductor layers may be formed from single crystalline materials, amorphous materials, or polycrystalline materials. However, single crystalline materials are preferred from an efficiency perspective, because efficiencies are available in excess of about 20% in specific single crystalline photovoltaic cells. Nevertheless, the disadvantage associated with single crystalline materials is the high cost of the material as well as the difficulty in depositing the single crystalline materials.

On the other hand, in the case of amorphous materials, one must contend with low carrier mobility, low minority carrier life time, low efficiency, and issues of cell stability. Therefore, while single-crystalline and amorphous materials are utilized in some photovoltaic device applications, semiconductor layers composed of polycrystalline materials are viewed as the preferred alternative for the production of photovoltaic devices that would be economically viable for a wide range of applications.

Polycrystalline materials offer numerous advantages for the production of the photovoltaic cells. However, there is a desire in the industry of the field of polycrystalline materials to increase the efficiency of the polycrystalline photovoltaic cells from the current efficiencies of about 5–10% range to about a range of about 10–15%, and ultimately to advance the efficiencies of polycrystalline photovoltaic cells closer to the 15–25% range of the single crystalline materials.

Cadmium telluride is a semiconductor with electrical properties recognized in the industry as well suited for conversion of sunlight into electrical energy. The material has a bandgap that is nearly optimum for conversion of terrestrial solar radiation and the ability to be doped n-type and p-type, that permits the formation of a large range of junction structures.

One significant technological problem with CdTe-based devices is that it is difficult to form an ohmic contact to the p-type form of the material. This is observed for both single crystalline and polycrystalline p-type CdTe, and results from a combination of large semiconductor work function, and the inability of CdTe to sustain sufficiently high p-type carrier concentration to enable quantum-mechanical tunneling of charge carriers at the CdTe/metal contact interface. In addition to these fundamental problems, the polycrystalline p-type CdTe material used as the absorber in a CdS/CdTe photovoltaic device is typically treated with Cl-containing liquids or vapors just prior to the formation of ohmic contact. The Cl treatments improve junction performance, but also can produce a CdTe surface that is rich in Cl. Furthermore, the formation of oxide layers from atmospheric oxygen or other processes can alter the chemical properties of the p-type CdTe surface. These factors can effect the electrical transport at the contact interface, and alter the characteristics of the ohmic contact.

To remove the contaminated outer surface of the p-type CdTe, wet chemical treatments are often used. In addition to removing unwanted contamination from the surface, these treatments often have the added benefit of forming a Te-rich layer at the surface, and this Te-layer assists in forming the ohmic contact.

Accordingly, there is a need in the art of preparing the back surface of CdS/CdTe thin-film photovoltaic devices, to minimize and/or eliminate the effect of variations and provide uniform reproduceable surfaces onto which subsequent contact layers can be applied—by first utilizing a "dry process" which is inherently compatible with in-line manufacturing and does not produce significant waste products.

U.S. Pat. No. 4,319,069 discloses chemical treatment of a p-CdTe surface prior to contacting to improve the contact characteristics. $HNO_3$ (oxidizing acid) plus $H_3PO_4$ (leveling agent) is employed to form the Te layer. In this patent, the use of ~5% $HNO_3+H_3PO_4$ chemical pretreatment is used to improve the contact characteristics, and is a subtractive process.

Chemical treatment of a p-CdTe surface prior to contacting to improve the contact characteristics, by use of an oxidizing acid plus a reducing agent (hydrazine or metal alkalide) is disclosed in U.S. Pat. No. 4,456,630. The use of the chemical pretreatment to improve contact characteristics is subtractive processing, and in such a process, generally, there is very limited control over characteristics such as removal rate, selective grain-boundary etching, and thickness of the resulting Te-layer formation.

U.S. Pat. No. 4,766,084 discloses a process for producing an electric contact on a HgCdTe substrate having a p conductivity and application to the production of an N/P diode, and specifically uses ion bombardment for removal etching of the $SiO_2$ insulator layer.

A process for replacement of chemical etching with a process involving $CF_4$ plasma etching plus heat treatment to form an improved gate area in n-type α-Si on top of intrinsic α-Si is disclosed in U.S. Pat. No. 4,581,099.

SUMMARY OF THE INVENTION

One object of the invention is to provide improved photovoltaic device performance by decreasing the loses associated with the back contact by preparing the surface of p-type CdTe films utilizing a method which avoids wet chemical treatments.

Another object of the present invention is to provide a process for treating the surfaces of p-type CdTe films that have not been prepared utilizing wet chemical treatments, but instead, ion-beam treatment to improve ohmic contacts.

In general the invention is accomplished by placing a CdS/CdTe sample into a chamber capable of evacuation to pressures >1e-5 torr through the use of appropriate high vacuum pumps. The sample is oriented on a sample holder with the p-CdTe side of the sample facing apparatus capable of generating Ar atoms and ions of preferred energy and directionality (i.e., an ion source). The sample may be positioned on a sample holder that can allow for sample heating, and/or impart movement to the sample and thereby improve the uniformity of the ion-beam exposure.

Once high vacuum is established within the processing chamber, the ion source is ignited and the sample is exposed to energetic Ar atoms and ions. During ion exposure the source-to-substrate distance is maintained such that it is less than the diffusion length of the Ar atoms and ions at the vacuum pressure. During sample exposure, the directionality of the source beam may be varied from normal incidence to oblique angles, thereby permitting substrate movement. The angle of the ion gun may be varied as well as the aperture of the ion source. Further, the time of ion beam exposure is typically less than five minutes, and changes in device performance are related to exposure time.

Following the ion-beam processing, deposition of appropriate contact layers should be performed before the plasma-processed CdTe surface is exposed to air or other contamination.

BRIEF DESCRIPTION OF THE DRAWINGS

A more complete appreciation of the invention and the advantages attendant thereof will be obtained by reference to the detailed description when considered in connection with the accompanying drawings, wherein:

FIG. 1 shows the various layers of a solar cell configuration.

FIG. 2 illustrates one of the basic problems with contacting semiconductor materials such as p-CdTe and p-ZnSe. FIG. 2a shows the position, relative to the vacuum level (energy=zero), of the conduction-band, valance-band, and Fermi energy levels for a semiconductor such as p-CdTe. FIG. 2b shows, in approximate relationship to the energy levels of the semiconductor, the energy level (i.e., metal work function) that would be associated with a typical metal having a high work function (>5.0 eV).

FIG. 3 shows an energy-band diagram illustrating the function of a CIFL in an idealized situation where the position of the Fermi level at the p-CdTe surface is not pinned or affected by artifacts of contamination.

FIG. 7 shows scanning-electron microscope (SEM) images illustrating effects of wet chemical process on polycrystalline CdTe films.

FIG. 8 showns XPS surface scans illustrating the effect of bombardment of single crystalline p-CdTe with 500 eV Ar neutrals.

DETAILED DESCRIPTION OF THE INVENTION

Figure 2C:
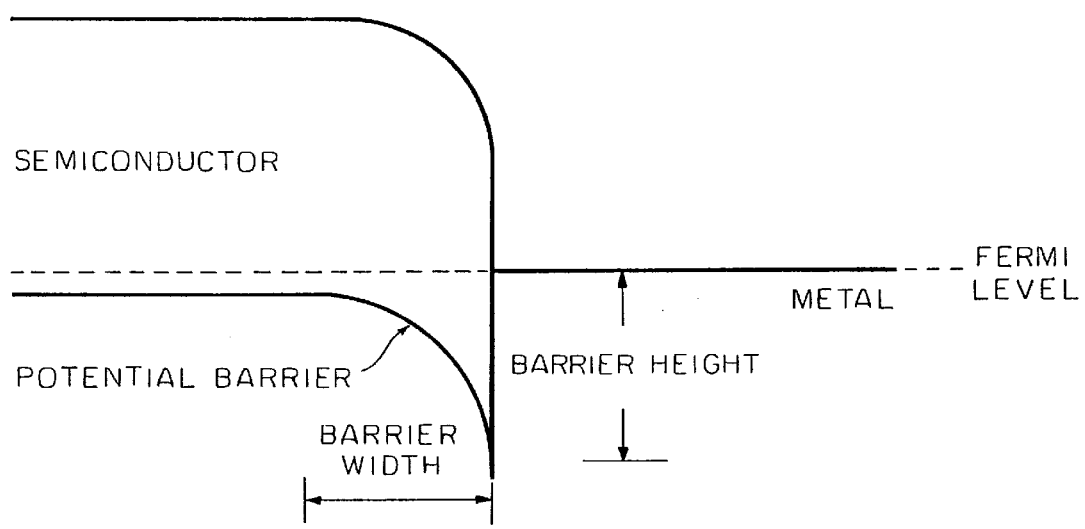
As illustrated in FIG. 2c, when the p-CdTe semiconductor and the high-work function metal are brought into intimate contact, the Fermi level near the surface of the semiconductor will equilibrate with the position of the metal work function. This will cause the conduction and valance bands of the semiconductor to bend downward and form a barrier, as shown in the figure. Depending upon the specific material and electrical properties of the semiconductor and the metal, the barrier will have a specific "width" and "height" as shown in the figure. For the case of p-CdTe and typical metals, the charge carriers will have insufficient energy to flow over the barrier, thus limiting current transport between the metal and the semiconductor. This limitation will lead to contact resistance in the solar cell that can become a part of the total series resistance in the solar cell, and thereby limit cell performance. Note that if a metal with a smaller value of work function is chosen, the barrier height will be even larger, further limiting cell performance. Typically, the resistance associated with this type of contacting problem can be minimized by producing a very high p-type carrier concentration in the region in the p-CdTe immediately adjacent to the metal. This technique will produce a barrier width that is sufficiently narrow to allow low-resistance charge transport across the barrier by the process known as quantum-mechanical tunneling. However, because the maximum p-type carrier concentration in CdTe is limited by compensation mechanisms, low-resistance tunneling has not been demonstrated between metals and p-CdTe.
Figure 3:
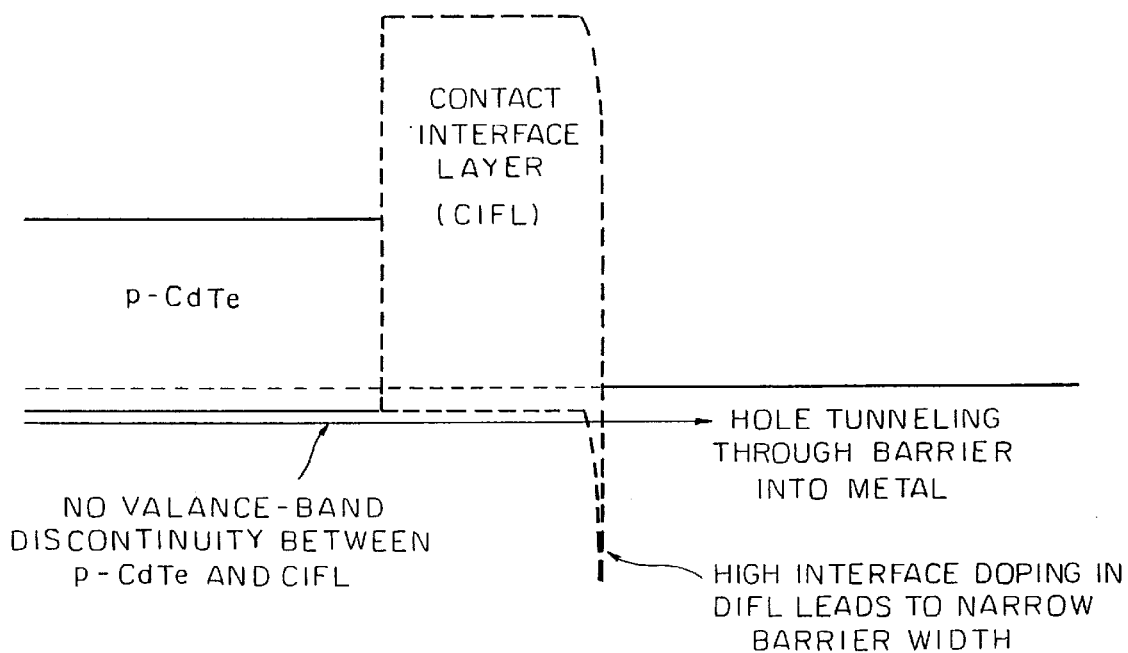
FIG. 3 shows an energy-band diagram illustrating a resolution of the problems associated with forming low-resistance ohmic contact to p-CdTe. In this technique, a contact interface layer (CIFL) is placed between the p-CdTe and the outer metallization. For the case of ohmic contact to p-CdTe, the CIFL is chosen so that it produces a small discontinuity at the valance band. The CIFL is also chosen so that it can be fabricated to have a sufficiently high p-type carrier concentration to facilitate quantum-mechanical tunneling of charge between the CIFL and outer metallization. Because of its material and electrical properties, the semiconductor p-ZnTe has been shown to be a useful CIFL for this application.
Figure 4:
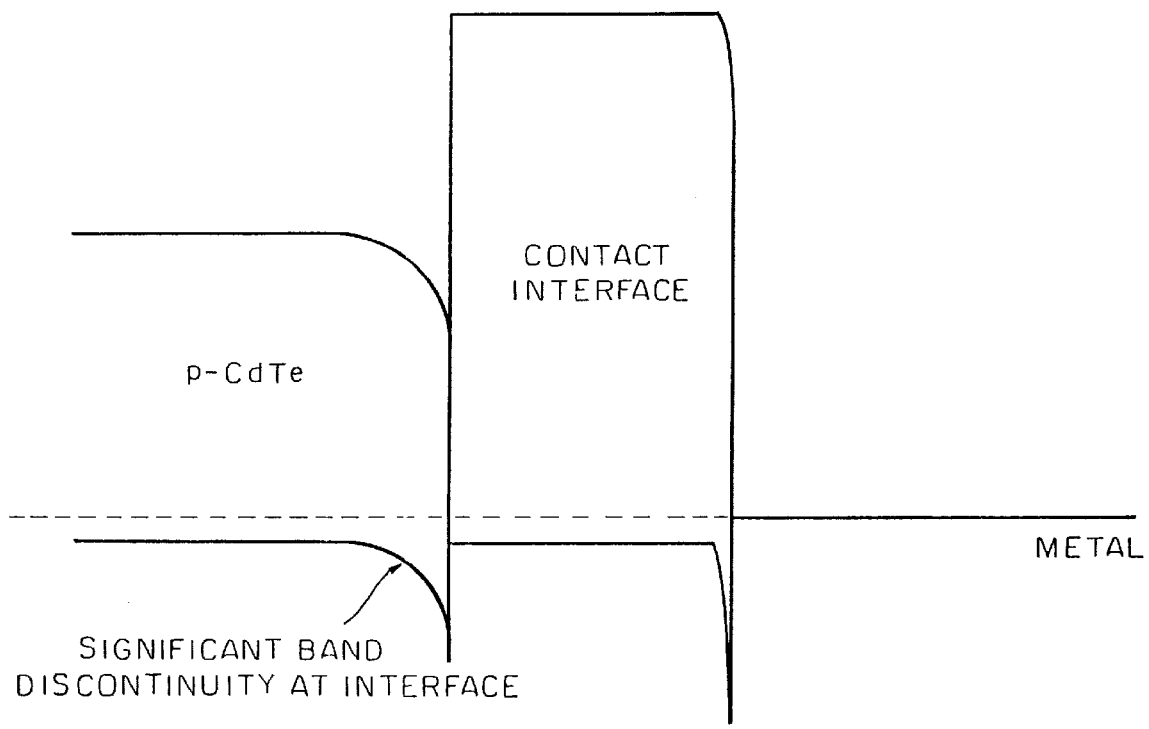
FIG. 4 shows an energy-band diagram illustrating a barrier at the p-CdTe/CIFL that forms if the Fermi level at the p-CdTe surface is pinned toward mid gap by the presence of artifacts due to intrinsic interface states, interface mixing, residual surface layers, or contamination. In this situation, although current transport at the CIFL/metal interface can proceed via low-resistance tunneling, significant resistance in the contact remains because of the potential barrier formed at the p-CdTe/CIFL interface. It is the reduction or elimination of this barrier that is the object of this invention.
Figure 5A:
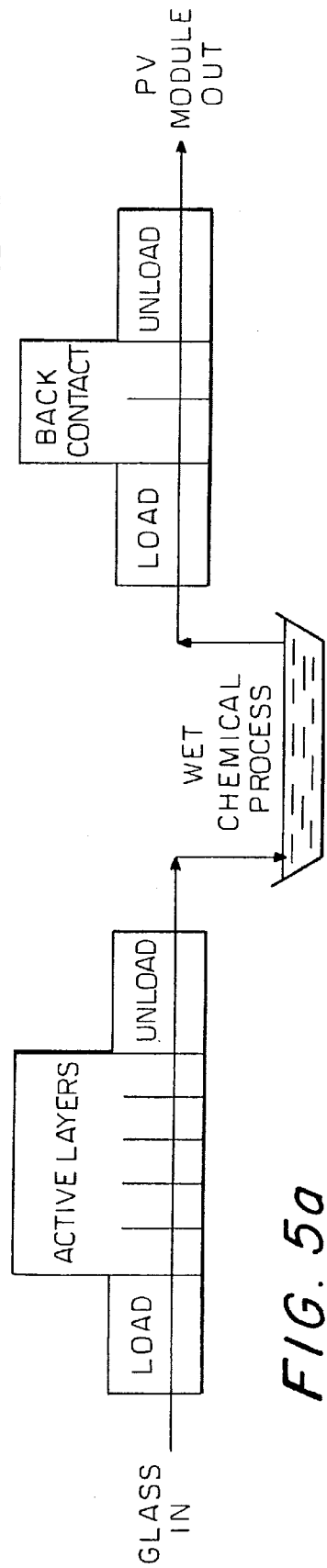
FIG. 5 shows a flow diagram illustrating the state-of-the-art process for CdS/CdTe photovoltaic cell manufacture and a flow diagram illustrating an improved process sequence that results from the incorporation of this invention. The diagrams shows that by eliminating the wet chemical process, some components of the process sequence can be eliminated, and the process be streamlined. Further, by replacement of the wet chemical process with a dry process as described by this invention, process reproducibility is improved and chemical waste is reduced.
Figure 5B:
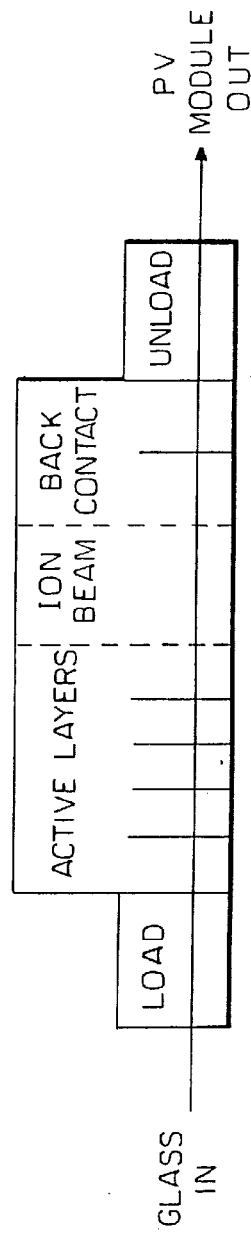
Figure 6:
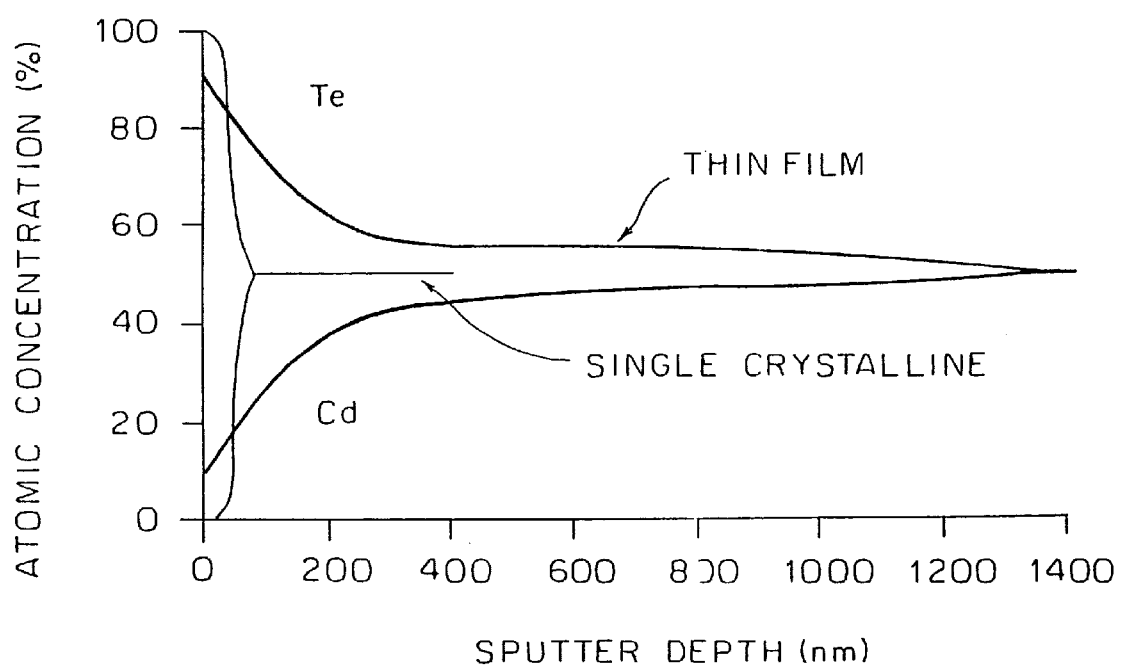
FIG. 6 is an x-ray photoelectron spectroscopy (XPS) depth profile illustrating the effects of a wet chemical process on the single crystalline and polycrystalline CdTe. The figure shows that a wet chemical etch composed of $HNO_3:85H_3PO_4:33H_2O$ will form a Te-rich layer on the surface of both single crystalline and polycrystalline CdTe. The figure shows that the depth of the Te-rich region extends farther into the bulk of the polycrystalline material than for the single crystalline material. Although the Te-rich region formed by the wet chemical etching assists the formation of ohmic contact, the extent to which the p-CdTe is effected is dependent on etching parameters, and these are often difficult to control. For this reason, the reproducibility of wet chemical processes is viewed as inferior compared to the dry processes, such as those described by this invention.
Figure 7A:
FIG. 7a shows a cross-section view of a polycrystalline CdTe film before wet chemical processing.
Figure 7B:
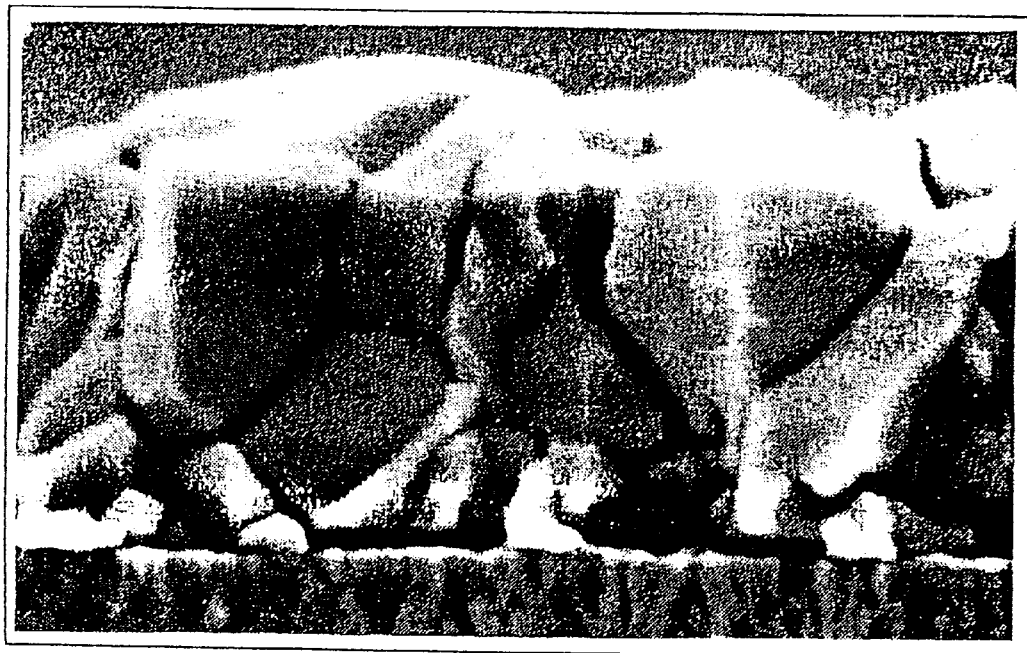
FIG. 7b. shows a cross-section view fo a polycrystalline CdTe film that has been etched for 5 minutes using $HNO_3:85H_3PO_4:33H_2O$. The photographs illustrates that this wet chemical processing leads to preferential etching along grain boundaries. The resultant grain boundary etching may enhance diffusion of materials from the back contact toward the junction region. It is well known that significant diffusion of certain metals (such as Cu) into the junction region can lead to losses in cell performance and to long-term instability. Because the dry processes identified in this invention predominantly effects only the surface of the polycrystalline CdTe, grain-boundary etching is avoided and related diffusion concerns are minimized.

FIG. 1 shows various layers of a solar cell configuration. In this configuration, light enters through the glass substrate 10.The substrate is typically called a superstrate when the cell is designed to have the light incident on the substrate side. The light is absorbed predominantly in the p-CdTe layer 11.The figure shows the location of the transparent-conducting oxide (TCO) layer 12 that forms the transparent electrical top contact to the n-type CdS layer 13,and the location of the semiconductor n-p junction 14 between the n-CdS and p-CdTe. The figure shows the location of a contact-interface layer (CIFL) 15 that optionally may be placed between the CdTe and an outer back metallization to improve the performance of the contact. The interface 16 between the CdTe and the CIFL is where the plasma etching process is applied prior to deposition of the CIFL and/or back metallization or metal back contact 17.

EXAMPLE

Figure 9:
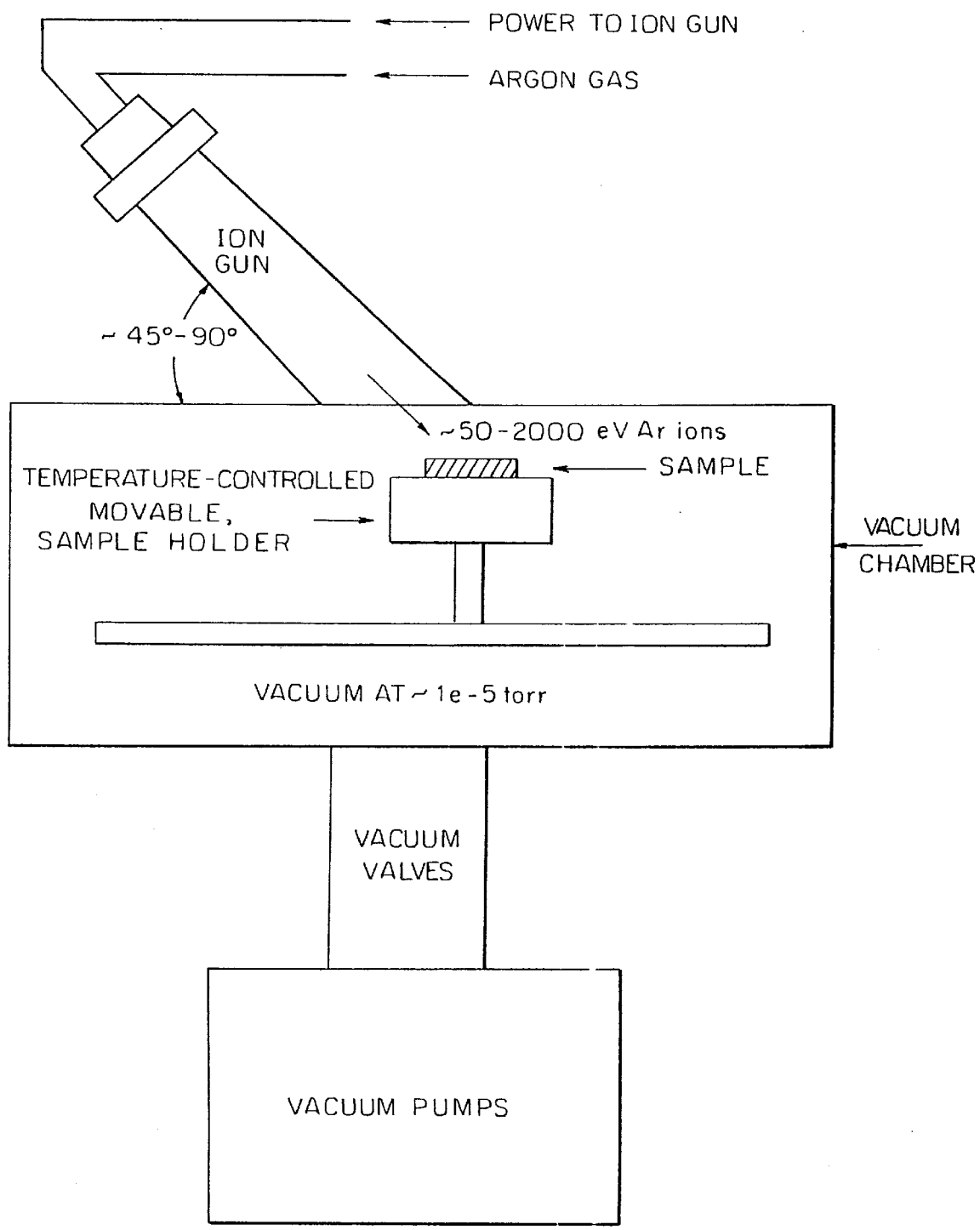
FIG. 9 shows a schematic diagram of a typical ion-beam etching system of the invention process.

The CdS/CdTe is placed into a chamber that is evacuated to pressures >1e-5 torr through the use of appropriate high vacuum pumps. The sample is oriented on a sample holder with the p-CdTe side of the sample facing apparatus capable of generating Ar atoms into ions of preferred energy and directionality (i.e., and ion source). The sample may be positioned on a sample holder that allows for sample heating, and/or impart movement to the sample and thereby improve the uniformity of the ion-beam exposure. As can be seen from FIG. 9, the sample is placed on a temperature-controlled, movable sample stage or holder 18 that is located in a vacuum chamber 19.The chamber is evacuated to ~1e-5 torr, and the sample 20 is positioned such that the Ar ions and atoms generated by an ion gun 21 are directed toward it. Energies of the ion gun will be in the range of ~50–2000 eV.

Figure 8B:
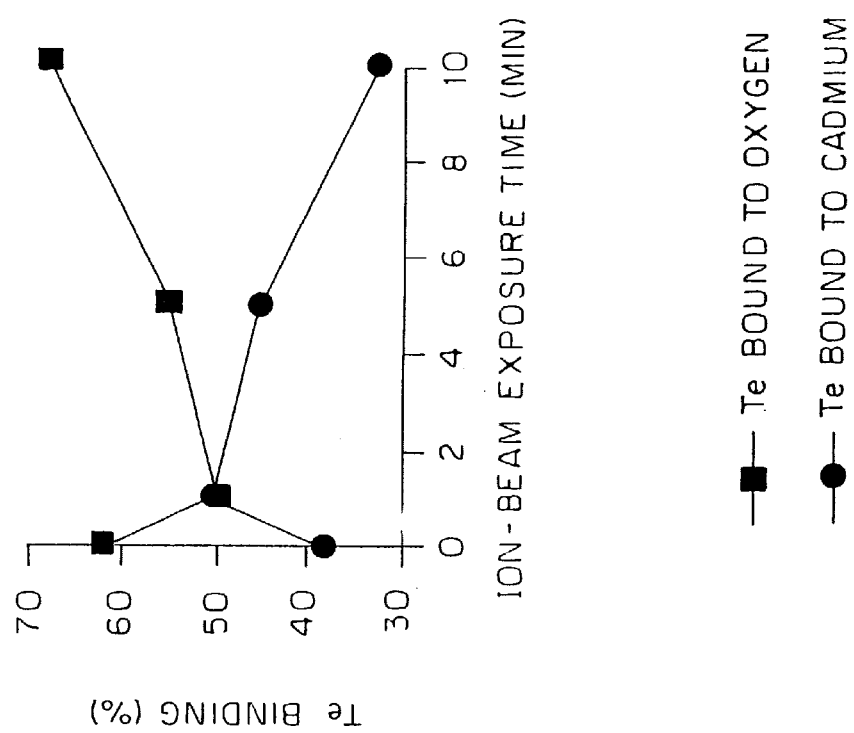
FIG. 8b shows that, for exposure times >1 min., the surface becomes increasingly likely to form oxides. The data indicate that, with proper control of exposure time, exposure to energetic Ar atoms can yield p-CdTe surface stoichiometries advantageous for ohmic contact formation.
Figure 8A:
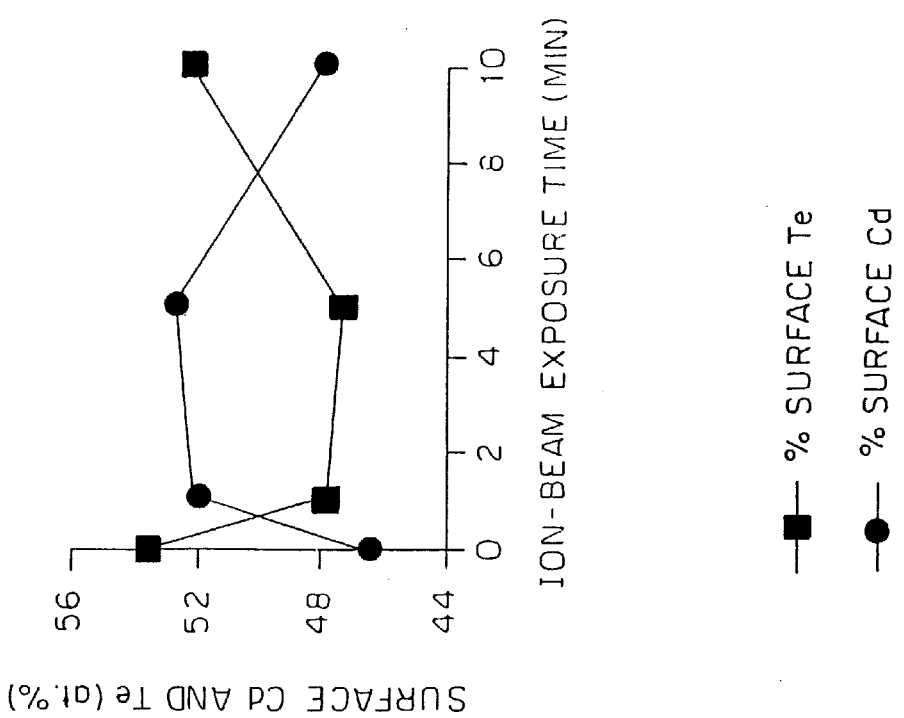
FIG. 8a shows that for the bombardment conditions used, the surface stoichiometry can be altered from the Cd-rich, to Te-rich within exposure times of <1 min. However.

The vacuum chamber is connected to vacuum valves 22 which are connected to vacuum pumps 23. The bombardment of the sample surface by the energetic Ar atoms and ions causes the changes in the surface stoichiometry of the p-CdTe noted in FIG. 8. Through proper control of the ion-beam process parameters, p-CdTe surface stoichiometries advantageous for ohmic contact formation result. In addition to relying on Ar ions for bombardment of the p-CdTe surface, other gas species may be optionally added to gas flow through the ion gun to yield p-CdTe surfaces with stoichiometries advantageous for ohmic contact.

Once the high vacuum is established within the processing chamber, the ion source is ignited, and the sample is exposed to energetic Ar atoms and ions (~50–2000 eV). During ion exposure, the source-to-substrate distance is maintained such that it is less than the diffusion length of the Ar atoms and ions at the vacuum pressure (i.e., >500 mm for a chamber pressure of 1e-5 torr). During sample exposure, the directionality of the source beam may be varied from normal incidence to oblique angles, thereby allowing substrate movement.

Additionally, the fixed angle of the ion gun may be non-normal.

In accordance with the invention, the experiments used in developing this invention utilized an ion source with an aperture of 3 cm, and exposure angles of 90° and 45° were used. The time of ion beam exposure is typically less than five minutes, and changes in device performance are related to the exposure time.

The average performance values for ion-beam processed CdS/CdTe devices (from 4 cells) are as follows:

| Sample Id Comment | Voc | Jsc | FF | n | Rseries | Rshunt |
| --- | --- | --- | --- | --- | --- | --- |
| UC232A No IB (Best) | 809 mV | 20.5 mA/cm2 | 65.6% | 10.9% | 15 Ohm-cm2 | 990 Ohm-cm2 |
| UC240A Meth + IB (First) | 805 mV | 21.3 mA/cm2 | 65.4% | 11.25% | 10.05 Ohm-cm2 | 2274 Ohm-cm2 |
| UC240B NP + IB (First) | 784 mV | 21.3 mA/cm2 | 58.5% | 9.78% | 19.75 Ohm-cm2 | 1409 Ohm-cm2 |
| UC264#2 Meth + IB (Best) | 809 mV | 21.6 mA/cm2 | 71% | 12.2% | 6.9 Ohm-cm2 | 1176 Ohm-cm2 |

The process described herein is used to prepare the back surface of the CdS/CdTe thin-film photovoltaic PV devices (i.e., the p-CdTe surface) for subsequent contact layers. The reasons for this is that the p-CdTe surface is not of appropriate condition for the formation of ohmic contacts. This situation results because of surface layers and contamination remaining from previous processes to which the cell has been exposed. While processes have been developed that provide improved contact performance, these contact formation processes require that the starting p-CdTe surface be uniformly free of unwanted contamination and/or uncontrolled stoichiometry. Further, Cl based treatments are often used to optimize the performance of the PV device. Because of this, the near-surface region of the back surface may contain significant amounts of residual Cl, and/or related contamination. Or, the surface may be heavily oxidized by environmental exposure prior to contacting. Surface oxidation can also result from utilizing a "wet chemical" process.

Therefore, the process of the present invention is used to minimize and/or eliminate the effect of these variations by providing a uniform and reproduceable surface onto which subsequent contact layers can be applied. More importantly, the process of the invention is a "dry process" and therefore inherently compatible with in-line manufacturing and does not produce significant waste products.

Following the ion-beam treatment process, it is important to deposit appropriate contact layers before the beam-processed surface of the CdTe is exposed to air or other contamination.

While the invention has been described in detail with reference to preferred embodiments, it is to be understood that variations and modifications can be effected within the spirit and scope of the invention, without departing from the spirit of the invention.

What is claimed is:

1. A dry process for making a low-resistance uniform and reproducible surface for electrical contact between a metal and a layer of polycrystalline p-type CdTe surface by ion beam processing comprising:

a) placing a CdS/CdTe device into a chamber and evacuating said chamber to create a vacuum of ~1e-5 torr;

b) orientating the polycrystalline p-CdTe side of the CdS/CdTe device to face apparatus capable of generating Ar atoms and ions of preferred energy and directionality;

c) introducing Argon and igniting an area of said apparatus to generate Ar atoms and ions of preferred energy and directionality in a range of ~50–2000 eV in a manner so that during ion exposure, the source-to-substrate distance is maintained such that it is less than the mean-free path or diffusion length of the Ar atoms and ions at said vacuum; and d) allowing exposure of the polycrystalline p-CdTe side to said ion beam for a period less than about 1 minute to alter the surface stoichiometry from Cd-rich to Te-rich prior to forming a contact interface or semiconductor layer.

2. The process of claim 1 wherein said mean-free path of Ar atoms and ions are >500 mm.

3. The process of claim 2 wherein said ion source has an aperture of about 3 cm.

4. The process of claim 3 wherein the exposure angle of the sample to the ion source is between about 45° and about 90°.

* * * * *